Figure 1A:
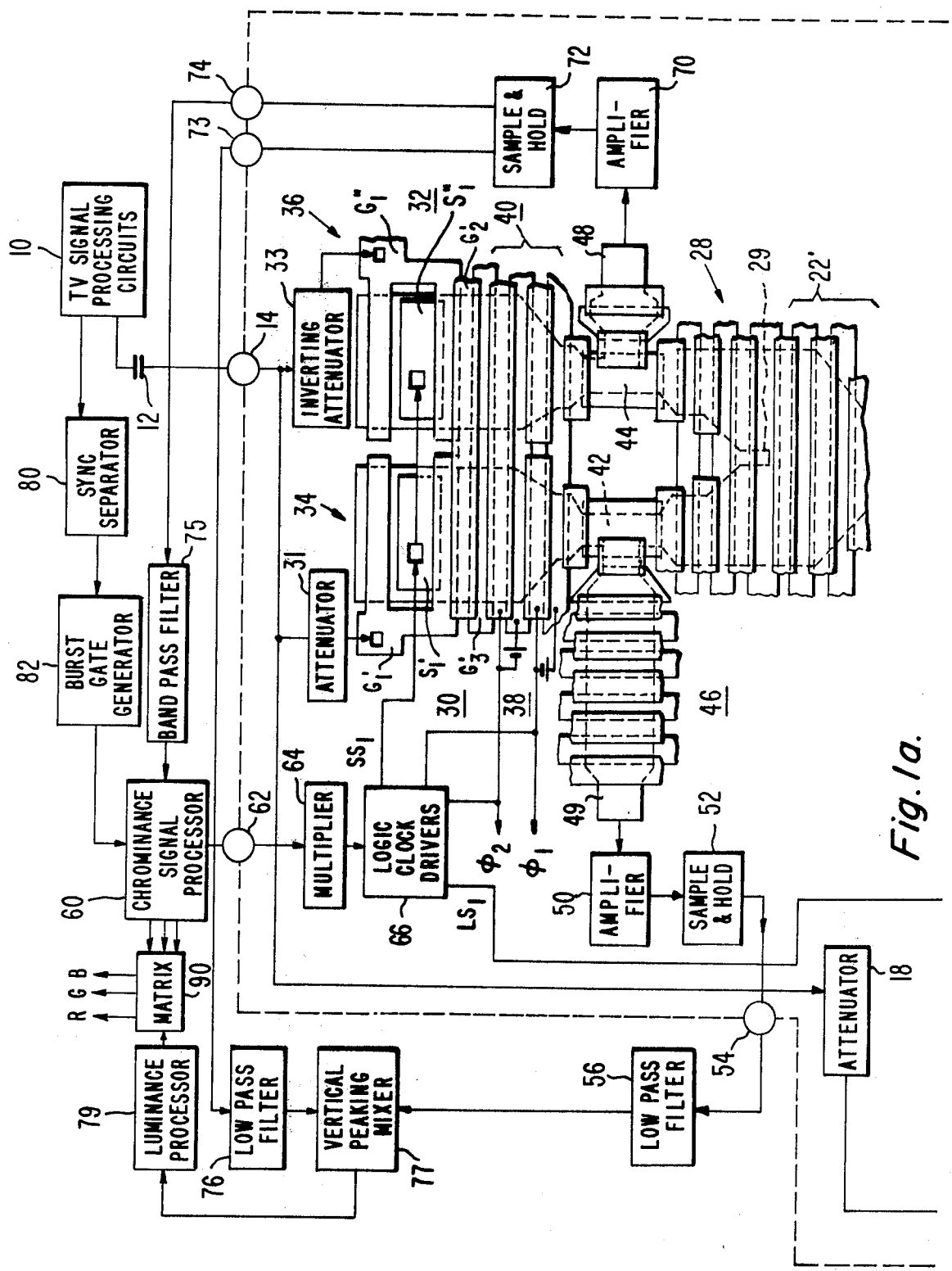

United States Patent [19]
Carnes et al.

[11] 4,217,605
[45] Aug. 12, 1980

[54] COMB FILTER EMPLOYING A CHARGE TRANSFER DEVICE WITH PLURAL MUTUALLY PROPORTIONED SIGNAL CHARGE INPUTS

[75] Inventors: James E. Carnes, Indianapolis, Ind.; Robert H. Dawson, Princeton; Walter F. Kosonocky, Skillman, both of N.J.

[73] Assignee: RCA Corporation, New York, N.Y.

[21] Appl. No.: 930,379

[22] Filed: Aug. 2, 1978

[51] Int. Cl.² .......................................... H04N 9/535
[52] U.S. Cl. ................................................. 358/31
[58] Field of Search ...................... 358/31, 213, 43–45; 357/24; 364/825, 862; 333/165; 328/166, 167, 139; 307/221 D

[56] References Cited

U.S. PATENT DOCUMENTS

| | | | |
|---|---|---|---|
| 3,994,850 | 3/1976 | Walden | 307/221 D |
| 4,032,767 | 6/1977 | Lagnado | 357/24 |
| 4,096,516 | 6/1978 | Pritchard | 358/31 |

OTHER PUBLICATIONS

Sequin et al., *Charge Transfer Devices*, Academic Press, 1975, pp. 60 and 61.
Shott et al., "The Razorback CCD: A High Performance Parallel Input Delay Line Architecture", *1975 IEEE International Solid State Circuits Conference*, pp. 150, 151 and 227.

*Primary Examiner*—John C. Martin
*Attorney, Agent, or Firm*—Eugene M. Whitacre; William H. Meagher; Ronald H. Kurdyla

[57] ABSTRACT

A comb filter comprising a charge transfer device (CTD) structure for separating frequency interleaved luminance and chrominance components of a composite color television signal directly within the CTD structure. The CTD structure has first and second pairs of input sections of substantially identical geometry, one input section of the second pair being preceded by a signal inverter. Signal charge as applied to the first and second input pairs are delayed such that signal charge from the first input pair exhibits a 1H delay relative to signal charge from the second input pair, when the signal charge from the respective input pairs are combined with each other. A first charge summing well combines mutually in-phase signal charge at multiples of the line scanning frequency from the first and second inputs to provide a combed luminance signal charge component, while a second well combines mutually inverted or out-of-phase signal charge at these frequencies from the first and second inputs to provide a combed chrominance signal charge component.

13 Claims, 2 Drawing Figures

COMB FILTER EMPLOYING A CHARGE TRANSFER DEVICE WITH PLURAL MUTUALLY PROPORTIONED SIGNAL CHARGE INPUTS

BACKGROUND OF THE INVENTION

This invention relates to electronic signal processing apparatus employing a plurality of signal delaying stages of the charge transfer device (CTD) type.

A charge coupled device (CCD), which is one version of the charge transfer device, is well suited for processing analog signals. These devices include input structures for converting a signal voltage or current to an amount or packet of charge in a transfer channel, and output structures for measuring the charge in the packet at the output of the channel.

A considerable amount of design effort has been expended to provide substantially linear conversion from input signal voltage or current to charge and back again. Any non-linearities in these processes are particularly troublesome where a plurality of signals are supplied to a plurality of inputs of a CCD for combining in predetermined proportions to produce a desired filter characteristic. Such a situation is encountered, for example, where the CCD is a part of a comb filter for color television signals and is constructed in the manner described in U.S. pat. application Ser. No. 781,303 entitled "Electronic Signal Processing Apparatus" filed Mar. 25, 1977, in the name of D. H. Pritchard and assigned to the same assignee as the present invention, now U.S. Pat. No. 4,096,516.

In the Pritchard comb filter, a composite video signal, including frequency interleaved luminance and chrominance signal components, is supplied to a first signal path including a number of delay elements arranged to exhibit a total delay incrementally greater than the period of a television line scanning interval (i.e., 1H). The composite video signal is also supplied to second and third signal paths, each of which is arranged to exhibit a delay equal to the incremental difference between the line scanning interval and the total delay of the first path. The differences in delay between the first and second paths, and between the first and third paths, are thereby equal to 1H. The delay is accurately determined since it is dependent substantially only upon the difference in the number of delay stages (a geometric certainty) and upon the clock frequency associated with the signal transfer. The clock frequency can be controlled to a high degree of accuracy, for example, by use of a crystal oscillator. Luminance signals are derived by additively combining the signals from the first and second paths while chrominance signals are derived by subtractively combining the signals from the first and third paths. The subtraction is most readily performed by inverting the composite video signal supplied to the third path and then adding the outputs of the first and third paths. This latter addition of signals provides a comb filter response with maxima at the color subcarrier frequency and all other odd multiples of one-half the line scanning frequency, while the addition of signals from the first and second paths provides a comb filter response with maxima at multiples of the line scanning frequency. The relative depth of the notches in each of the two filter responses depends upon the accuracy with which the amplitude and phase responses for the two associated signal paths are matched and the accuracy of the difference in time delay between the two paths. The accuracy of the time delay may be set consistently by the delay difference technique of Pritchard.

The present invention provides practical solutions to the problems of matching amplitude and phase responses of two or more signal delay systems, providing proper weighting of the signals from two such systems to achieve a desired degree of signal cancellation, and reproducing characteristics from one CCD circuit chip to another and providing a reasonable economy of chip area.

STATEMENT OF INVENTION

In accordance with the invention, a comb filter comprises a charge transfer device arrangement for processing a video signal containing image-representative luminance and chrominance components disposed within a frequency spectrum of the video signal in frequency interleaved relation. The arrangement includes first and second charge combining wells, and first and second inputs for coupling signal charge representative of mutually complementary versions of the video signal to the first and second combining wells, respectively. Each of the first and second inputs has a predetermined geometry for determining its video signal voltage to charge amplitude conversion characteristic. Also provided is a third input responsive to the video signal and having a predetermined geometry for determining the video signal voltage to charge amplitude conversion characteristic of the third input. The geometry of the third input is related to the geometry of the first and second inputs such that the effective voltage to charge amplitude conversion characteristic of the third input is substantially equal to the aggregate of the voltage to charge amplitude conversion characteristics of the first and second inputs. Signal charge from the third input is received by a charge transfer channel comprising a plurality of delay stages. A first delayed signal charge portion from the channel is coupled to the first charge combining well, and a second delayed signal charge portion from the channel is coupled to the second charge combining well. Each of the first and second coupled delayed signal charge portions is delayed relative to the charge coupled to the respective first and second charge combining wells from the first and second inputs by an amount corresponding to a horizontal line scanning interval. The first and second delayed signal charge portions are relatively proportioned in a manner substantially identical to the relative proportioning of the voltage to charge amplitude conversion characteristics of the first and second inputs.

In accordance with a feature of the invention, the third input comprises a pair of inputs each of which exhibits a geometry substantially identical to the respective geometries of the first and second inputs.

Figure 1B:
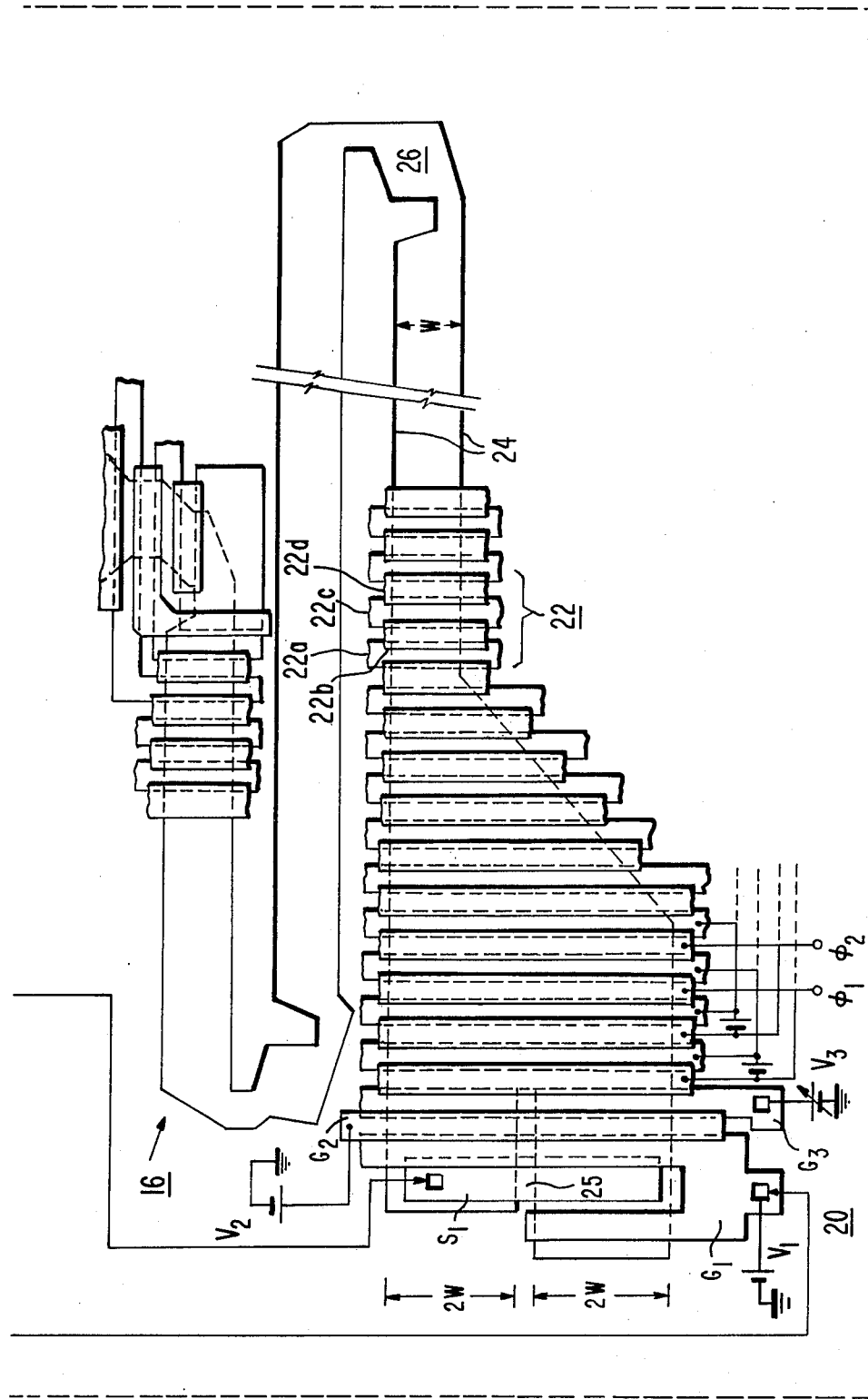

FIGS. 1a and 1b comprise a circuit diagram partially in block form and partially in pictorial form, of an embodiment of this invention.

In the illustrated arrangement, composite color television video signals including luminance, chrominance and synchronizing signal components are provided by television signal processing circuits 10 which are conventional and may take the form of a portion of a broadcast receiver, a video signal reproducer of the disc or tape playback type or other equivalent apparatus. For purposes of explanation, the signal processing circuits 10 and remaining apparatus will be described in the context of a broadcast receiver suitable for processing NTSC (standard U.S. broadcast format) signals.

In the television receiver, signal processing circuits 10 include a video detector for providing frequency interleaved luminance and chrominance video signal components via a capacitor 12 to a terminal 14 of a signal processor enclosed by a dashed line. The luminance component occurs at integral multiples of the horizontal line scanning frequency, and the chrominance component occurs at odd multiples of one-half the line scanning frequency and alternates in phase during alternate line scanning intervals. All components enclosed within the dashed line are suitable for fabrication on a single monolithic integrated circuit chip of the N-MOS, P-MOS or C-MOS types. A significant portion of the chip is occupied by a multiple input, multiple stage CCD register or delay line configuration. The CCD delay line includes a relatively long delay portion 16 (FIG. 1b) associated with a charge transfer channel 24 of serpentine form. Long delay portion 16 is arranged to provide the previously mentioned signal delay incrementally greater than 1H (i.e., greater than 63.55 microseconds in the case to be described). The full bandwidth, composite video signal is coupled from terminal 14 via an attenuator 18 to an input section 20 of long delay portion 16. Input section 20 is arranged to provide a substantially linear conversion from signal input voltage to charge and preferably is constructed in the manner described in U.S. patent application Ser. No. 758,184 entitled "Linear CCD Input Circuit," filed January 10, 1977 in the names of J. E. Carnes, P. A. Levine and D. J. Sauer and assigned to the same assignee as the present invention.

As described by Carnes et al., input section 20 includes a first gate electrode $G_1$ to which a predetermined direct voltage level ($V_1$) is applied along with the video signal-representative voltage. Second and third gate electrodes $G_2$, $G_3$ are also included in input section 20 and are supplied, respectively, with a relatively constant direct voltage ($V_2$) and a direct voltage ($V_3$) which changes between two different levels in a predetermined manner during each clock or signal sampling cycle. A source electrode $S_1$ is also included in input section 20 and is supplied with a voltage waveform ($LS_1$) which changes between two particular levels in a predetermined manner during each clock cycle. The particular forms of the varying voltage waveforms $V_3$ and $LS_1$ (as well as the clock waveforms $\phi_1$ and $\phi_2$) are described in the Carnes et al. application. These and other required waveforms (e.g., $SS_1$) which recur at a desired signal sampling frequency of approximately 10.7 MHz are derived from crystal controlled color subcarrier generating circuits normally provided within the chrominance signal processor of a color television receiver. One suitable arrangement for such a chrominance signal processor is described in the Data Bulletin for the RCA Type CA3151 linear integrated circuit which is available from RCA Solid State Division, Somerville, New Jersey.

In this illustrated embodiment of the present invention, such a chrominance signal processor 60 includes a crystal controlled oscillator which produces a continuous wave output at the color subcarrier frequency (customarily referred to as 3.58 MHz). The color subcarrier wave is coupled via a terminal 62 to a frequency multiplier 64 which, in the preferred arrangement, is a frequency tripler constructed in monolithic form on the same integrated circuit as the CCD delay line. Logic and clock driver circuits 66 are arranged to process the 10.7 MHz continuous wave signal provided by multiplier 64 so as to produce oppositely phased, square wave clock signal ($\phi_1$, $\phi_2$), waveforms for the source electrodes ($LS_1$ and $SS_1$) and appropriate waveforms for the $G_3$ gates in the manner described in the above-noted Carnes et al. application.

Signal-representative charge is transferred from input section 20 into the buried charge transfer channel indicated by the boundary lines 24. The width of the boundary of channel 24 varies in a predetermined manner. Specifically, in the vicinity of input section 20, channel 24 is divided by a channel stop 25 into two equal parts, each having a width designated as "2W". The two parts of channel 24 are merged together following input section 20 to cause the signal charge produced in the two halves of input section 20 to combine. Channel 24 then is tapered in a regular manner to a width "W" in the vicinity of a delay stage 22 and is generally maintained at this width throughout its length with the exception of the vicinity of several 180° turns such as turn 26.

The two equal channel parts of width "2W" associated with input 20 are wider than the channel portion of width "W" in order to enhance the linearity of input voltage to charge transfer function at the input charge wells. However, the channel portion shown as having width "W" need not be one-half as wide or narrower than the two equal channel parts associated with input 20, and need only be wide enough to accommodate the total charge injected into channel 24 by means of each of the two equal channel parts of width "2W". As described in the Carnes, et al. patent application mentioned previously, the useful depth of the charge wells associated with input 20 is considerably less than the useful depth of the charge wells associated with channel 24 following input 20. This also promotes input linearity, and permits channel 24 of width "W" to accommodate the signal charge supplied from input 20.

Each of the turns 26 preferably is constructed in the manner set forth in U.S. patent application Ser. No. 786,402 entitled "CCD Structure," filed Apr. 11, 1977 in the name of Michael G. Kovac and assigned to the same assignee as the present invention, abandoned in favor of continuation U.S. patent application Ser. No. 943,146, now issued as U.S. Pat. No. 4,160,262, entitled, "CCD Electrode And Channel Structure For 180 Degree Turn". The serpentine delay portion 16 includes, for example, 683 ½ delay stages following the input section 20. Each of the delay stages includes four gate electrodes (such as electrodes 22a, 22b, 22c and 22d of stage 22) positioned in overlapping pairs with respect to buried channel 24 to provide a two phase charge transfer operation in a known manner as is described, for example, in the above-referenced Carnes et al. patent application. The serpentine delay portion 16 in this case includes, for example, a total of twelve parallel channel portions joined together by eleven 180° turns of the type noted above to provide the desired number of stages in a reasonable area.

Signal-representative charge packets coupled through long delay portion 16 are split into two substantially equal fractions (halves) by means of a charge splitting structure indicated generally by the reference numeral 28 (FIG. 1a). In the charge splitting structure 28 (one type of which is described, for example, at page 61 of the book entitled "Charge Transfer Devices" by C. H. Sequin and M. F. Tompsett, published in 1975 by Academic Press, Inc.), the width of channel 24 is increased in a regular manner under one or more of the sets of gate electrodes 22′ to distribute the signal charge substantially uniformly across the widened portion of channel 24 shown in FIG. 1a. A channel divider or channel stop 29 is positioned midway between the sides of the widened part of channel 24 to cause the signal charge to split into two equal halves. The leading edge of the channel divider is preferably positioned beneath the mid-point of the overlying storage gate electrode (e.g., such as represented by gate electrodes 22a or 22c) in order to achieve charge balance beneath the gate electrode before the charge is transferred, and thereby divided, in response to a charge transfer clock signal. Positioning the leading edge of the channel divider in this manner enhances the accuracy of the process by which the signal charge is divided into two equal halves, which are then supplied to respective signal summing wells 42 and 44.

The composite video signals supplied via terminal 14 are also coupled via an adjustable attenuator 31 and an adjustable inverting attenuator 33 to two additional relatively short signal delay portions 30, 32 (FIG. 1a) included in the CCD arrangement. Attenuators 31, 33 as well as attenuator 18 serve to provide appropriate input signal amplitudes in accordance with the CCD input requirements. The use of a signal inverting stage such as 33 preceding input section 36 represents one technique for generating an inverted signal. Another technique for generating the complement (i.e., inversion) of a given signal with a CCD structure is described in U.S. patent application Ser. No. 836,508 of Walter F. Kosonocky, entitled "CCD Circuit For Producing Charge And Its Complement" filed Sept. 26, 1977, now abandoned.

Short delay portions 30 and 32 include respective input sections 34 and 36 for converting composite video signal voltage variations in a substantially linear manner into packets of signal-representative charge. Input sections 34, 36 respectively include source electrodes $S_1'$ and $S_1''$ supplied with clock signal $SS_1$, and are of substantially identical geometry and each is associated with a channel width "2W". Input sections 34, 36 exhibit signal voltage to charge conversion characteristics which are substantially identical to each other and to the characteristics of each half of input section 20. The two separate inputs 20 and 34, 36 as described ensure that, for the same signal voltage level applied to these inputs, input 20 will exhibit twice as much signal charge as either input 34 or 36 independent of non-linear input channel width fringing effects (i.e., edge effects). If input sections 34 and 36 were each "2W" wide and a single input channel of width "4W" were employed for input 20, the amount of signal charge injected at input 20 would not necessarily be twice as great as the charge injected at input sections 34 and 36, especially in the case of narrow channel widths. Arranging channel 24 into two equal parts each of width "2W" in the vicinity of input 20, and afterwards merging these two equal channel parts into a single channel of width "W" as mentioned, serves to accurately provide the desired amount of charge.

The inverted and non-inverted signal-representative charge packets produced in input sections 34 and 36 are transferred through respective single delay stages 38 and 40 to respective signal combining stages including summing wells 42 and 44. As in the case of delay stage 22, single delay stages 38 and 40 include four gate electrodes in overlapping pairs with respect to the underlying charge transfer channel to provide a two phase charge transfer operation.

A significant difference between short delay portions 30, 32 and long delay portion 16 can be seen by inspection of the phase of clock signal applied to the first stage following the third gate electrode $G_3$ or $G_3'$ (which follows second gate electrode $G_2'$ and first gate electrode $G_1'$ of input section 34, and first gate electrode $G_1''$ of input section 36). Thus, in the case of long delay portion 16, the $\phi_1$ clock signal is applied to the first set of transfer electrodes following the $G_3$ gate while in the case of short delay portions 30, 32, the $\phi_2$ clock signal is applied to the first set of transfer electrodes following the $G_3'$ gate. This arrangement makes it possible to provide a difference in delay between the long and short delay portions which includes a half stages of delay (i.e., 682 ½ stages). Specifically, the long delay portion provides 683 ½ delay stages (1,367 half delay stages) between the input of the long delay portion and summing wells 42 and 44. The charge packets arriving at the summing wells from the long delay portion are therefore delayed by 682 ½ delay stages relative to the charge packets arriving at the summing wells from the short, single delay portion.

In this example, two-phase clock signals are used in the manner noted to provide the desired number of fractional delay stages (682 ½). A similar result can be obtained by using four-phase clock signals, and fractional delays of ⅓ and ⅔ can be obtained by using three phase clock signals in accordance with the requirements of a particular system.

Thus, the signal-representative charge packets arriving at summing well 42 from long delay portion 16 of channel 24 are delayed 682 ½ clock periods more than those charge packets arriving at well 42 via input section 34 and associated single delay portion 30. A similar result obtains with regard to the charge packets which arrive at summing well 44 from long delay portion 16 of channel 24, and from input section 36 and associated single delay portion 32. The charge packets respectively summed in wells 42 and 44 therefore are delayed relative to each other by a time corresponding to one horizontal image scanning interval (1H).

Due to the frequency interleaved nature of the NTSC television signal, the non-inverted charge packets when combined (added) in well 42 produce a "combed," luminance component with maxima occurring at multiples of the line scanning frequency. Likewise, the mutually inverted charge packets combined (i.e., effectively subtracted) in well 44 produce a "combed" chrominance component with maxima at the color subcarrier frequency and all other odd multiples of one-half the line scanning frequency.

Charge representative of the combed chrominance component appears at a channel end portion 48. This charge is converted to a signal-representative voltage in a substantially linear manner in accordance with conventional charge-to-voltage conversion techniques, such as disclosed in the book by Sequin and Tompsett mentioned earlier. The signal voltage representative of the combed chrominance component is amplified by amplifier 70, after which it is sampled by a keyed sample and hold unit 72 which in this case samples at a 10.7 MHz rate, or three times the chrominance subcarrier frequency (3.58 MHz). The sampled combed chrominance component appears at terminals 73 and 74.

The sampled combed chrominance component is coupled from terminal 74 to an input of chrominance processor 60 via a filter 75 which selectively passes the band of chrominance frequencies and rejects vertical detail and clock frequency related signals. Chrominance processor 60 is also supplied with burst gate pulses from the output of a burst gate generator 82 of conventional type. The burst gate pulses are developed by unit 82 in response to horizontal sync pulses derived from the television signal by a sync separator 80. The signals supplied to chrominance processor 60 are utilized to provide R-Y, B-Y and G-Y color difference output signals which are coupled to inputs of a signal matrix stage 90.

The combed luminance component appears at a channel end portion 49 after being delayed a given amount by a delay portion 46 comprising two delay stages. Delay portion 46 serves to delay the combed luminance signal developed at summing well 42 by a sufficient amount so that the chrominance and luminance components are properly time coordinated at the inputs of matrix 90. In this example, delay 46 primarily serves to compensate for chrominance phase delays attributable to chrominance bandpass filter 75. This use of delay 46 eliminates the need for a conventional discrete luminance delay equalization network (e.g., included in luminance processor 79) for equalizing the luminance and chrominance signal processing transition times prior to being combined in matrix 90. The charge representative of the combed luminance component appearing at channel end portion 49 is then linearly converted to a signal voltage, which is afterwards amplified by amplifier 50 and sampled by a keyed sample and hold unit 52 in essentially the same manner as accomplished for the combed chrominance component.

The sampled combed chrominance component appearing at terminal 73 is filtered by a low pass filter 76 and the sampled combed luminance component appearing at a terminal 54 is filtered by low pass (luminance bandpass) filter 56, to remove clock signal components from the combed luminance and chrominance signals. Filter 76 also serves to restore relatively low frequency luminance (vertical) detail information which is present in the combed chrominance component but which has been removed from the combed luminance component. For this purpose, low pass filter 76 exhibits a cutoff frequency below the frequency band occupied by the chrominance band (e.g., a cutoff frequency just below two Megahertz), for passing relatively low frequency vertical detail information while rejecting relatively higher frequency chrominance information contained in the output of sample and hold network 72. The luminance signal ultimately processed by a luminance processor 79 therefore includes a combed high frequency portion (occupying a band of frequencies above the cutoff frequency) from which chrominance signal frequencies have been removed, and an "uncombed" low frequency portion in which substantially all luminance signal frequencies have been preserved.

Output signals from filters 56 and 76 are combined in a vertical peaking mixer 77. Mixer 77 may comprise, for example, a signal combining amplifier which is gain controlled with respect to the signals supplied from filter 76. The amount of signal from filter 76 present in the luminance output signal of mixer 77 determines the amount of vertical peaking present in the luminance output of mixer 77. This output signal is then supplied to luminance processor 79 for further processing and amplification. The luminance output signal from processor 79 is combined in maxtrix 90 with the color difference signals from chrominance processor 60, to provide R, G and B color output signals. These signals are then applied to intensity control electrodes of a color kinescope (not shown).

The combed luminance component developed at charge accumulation well 42 is the result of an additive combining process whereby non-interlaced frequency components (e.g., luminance components) reinforce each other while the interlaced frequency components (e.g., chrominance components) are of polarities to cancel each other, to provide a comb filter response with maxima at multiples of the line scanning frequency. The combed chrominance component developed at charge accumulation well 44 is the result of an effective subtractive combining process (i.e., combining mutually inverted signals) which provides a comb filter response with maxima at the color subcarrier frequency and all other odd multiples of one-half the line scanning frequency. In this instance the non-inerlaced (luminance) frequency components are of polarities to cancel each other while the interlaced (chrominance) frequency components reinforce each other. The relative depth of the notches in each of the two filter responses depends upon the accuracy with which the amplitude and phase characteristics of the delayed and relatively undelayed charge transmission paths are matched, and also upon the accuracy of the time delay difference between the two paths. Also, accurate timing of the combed luminance component relative to the combed chrominance component assists to insure that the luminance and chrominance components are properly time coordinated at matrix 90.

Since the periodicity of combing is a function of the amount of delay, accurate periodicity requires accurate delay. That is, deviations from the amount of delay necessary to produce the desired periodicity should be kept at an acceptable minimum, as in the case of the disclosed arrangement. In this regard it is noted that the mutually non-inverted signal charge packets and the mutually inverted signal charge packets are directly combined in accumulation wells 42 and 44, respectively. This manner of charge combination eliminates any unwanted variable delay which may be introduced by the known technique of filtering before signal combining in order to remove clock signal frequency components. The amount of delay is precisely determined prior to signal charge combination in accumulation wells 42 and 44, since the delay is fixed by the clock signal frequency and the number of delay stages, so that the desired combing periodicity results. Although the combed luminance and chrominance signals are afterwards filtered by low-pass filters 56 and 76, any variable delay introduced by these filters does not affect the periodicity of the combed signals.

The amount of signal charges which are combined in wells 42 and 44 should be controlled accurately in order to achieve proper nulling at the signal frequencies at which the comb filters are to exhibit a minima response. This is accomplished in the present arrangement by providing substantially identical input sections 34, 36 and 20.

As mentioned previously, input sections 34, 36 are of substantially identical geometry and each is associated with a channel width "2W". Similarly, in the vicinity of input section 20, channel 24 is divided into two equal parts each of a width "2W" which are eventually merged into a channel width "W" and afterwards split into two equal halves just prior to accumulation wells 42 and 44. In this manner, the amount (i.e., amplitude) of the relatively delayed and undelayed signal charge respectively summed in wells 42 and 44 are substantially equal.

Present CCD design techniques permit charge to be translated (e.g., divided) such that, in the case of the present arrangement, substantially equal amounts of signal charge enter summing wells 42 and 44 from the long and short delay sections. However, small deviations of the input characteristics of the delay sections, or of the location of the channel stop divider (e.g., channel stop 29), may upset the desired accuracy of the filter response. Illustratively, deviations on the order of two to five percent could reduce the magnitude of the attenuation which occurs at the frequencies at which the filter is to exhibit a minima response (i.e., the null frequencies). If necessary, these deviations can be compensated for by means of adjustable attenuators 31 and 33 associated with input sections 34 and 36.

Attenuators 31 and 33 are situated prior to the two short delay sections associated with inputs 34 and 36. These attenuators can be adjusted by means of an appropriate external control such that the magnitude of the charge entering summing wells 42, 44 from the short delay sections associated with inputs 34, 36 exactly matches the magnitude of the charge entering the summing wells from the long delay section. Only two adjustments are required and these can be made at any two of the inputs, although adjustments associated with inputs 34, 36 are preferred. If attenuator 18 associated with input 20 were adjusted together with either of attenuators 31 and 33, the two adjustments would interact. Employing attenuators 31 and 36 for making any necessary adjustment in the charge levels permits the chrominance and luminance filter responses to be tailored independently. That is, attenator 31 can be employed to tailor the attenuation characteristic (i.e., the null depths) associated with the combed luminance component, while attenuator 33 can be similarly employed with respect to the combed chrominance component.

Charge attenuation caused by charge transfer inefficiency is considered to be negligible in this instance. Illustratively, long delay portion 16 provides 1,367 charge transfers and exhibits a transfer inefficiency of the order of $10^{-5}$ per transfer. The charge attenuation associated with this transfer inefficiency is of the order of 0.01, which corresponds to $-40$ db. This amount of attenuation is considered to be virtually insignificant and acceptable within the framework of processing color television signals as described.

In sum, the described CCD arrangement provides an advantageous means of accurately separating luminance and chrominance signals (or a plurality of equivalent signals) from a composite signal by means of a single CCD structure. The technique described for combining signal charge to provide separated luminance and chrominance components conserves chip area, is reproducible on a unit-to-unit basis, and avoids troublesome nonlinearities otherwise encountered with signal charge to voltage or current conversion accomplished prior to obtaining the desired separated signals.

More specifically, the described CCD comb filter arrangement employs only a single long delay channel (683 ½ delay stages) to accomplish multiple filtering functions, in this case two. The utilization of charge merging following input section 20, and subsequent charge splitting into two separate channels prior to combining signal charge in summing wells 42 and 44, permits this to be accomplished with only a single long delay line. In the absence of these features, the dual filtering function resulting in separated luminance and chrominance components could be accomplished by means of two separate long delay channels. Since two such long delay channels would occupy a considerable amount of integrated circuit surface area and would also result in considerable clock driver power dissipation; as a practical matter, two separate integrated circuit chips would very likely be required. A comb filter arrangement in accordance with the principles of the present invention can accomplish multiple filtering functions without exhibiting these limitations, and therefore can be fabricated within a single integrated circuit chip without difficulty. In this regard it is noted that, in the case of the disclosed arrangement, the integrated circuit surface area and the clock driver power dissipation can be minimized by making the width "W" of channel 24 as narrow as practical.

Although the invention has been disclosed in terms of a particular embodiment, other arrangements can be devised by those skilled in the art without departing from the scope of the invention.

The frequency of the two-phase clock signal is not limited to 10.7 MHz as in this example. Illustratively, the clock signal frequency can be four times the color subcarrier frequency, or 14.3 MHz. In this instance, a differential delay provided by 910 delay stages instead of 682 ½ delay stages would be required.

Also, the two equal channel parts of width "2W" associated with input 20 can be replaced by a single input channel of width "4W". The present configuration is preferred, however, since it provides more uniform tracking between the various input structures.

Although the invention has been described in the context of apparatus for separating the frequency interleaved luminance and chrominance components of an NTSC color television signal in accordance with United States broadcast standards, the invention is also applicable to apparatus for separating the components of equivalent frequency interleaved signals, including signals in accordance with PAL broadcast standards.

What is claimed is:

1. Comb filter apparatus for processing a video signal containing image-representative luminance and chrominance components disposed within a frequency spectrum of said video signal in frequency interleaved relation, comprising:
    a charge transfer device arrangement including
        first and second charge combining means;
        means for providing first and second inputs for coupling signal charge representative of mutually complementary versions of said video signal to said first and second combining means, respectively, each of said first and second inputs having a predetermined geometry for determining its video signal voltage to charge amplitude conversion characteristic;
        means for providing a third input responsive to said video signal and having a predetermined geometry for determining the video signal voltage to charge amplitude conversion characteristic of said third input, said geometry of said third input being related to said geometry of said first and second inputs such that the effective voltage to charge amplitude conversion characteristic of said third input is substantially equal to the aggregate of the voltage to charge amplitude conversion characteristics of said first and second inputs;

a charge transfer channel comprising a plurality of delay stages for receiving signal charge from said third input;

means for coupling a first delayed signal charge portion from said channel to said first combining means;

means for coupling a second delayed signal charge portion from said channel to said second combining means; and wherein each of said first and second coupled delayed signal charge portions is delayed relative to said charge coupled to the respective first and second combining means from said first and second inputs by an amount corresponding to a horizontal line scanning interval, said first and second delayed signal charge portions being relatively proportioned in a manner substantially identical to the relative proportioning of the voltage to charge amplitude conversion characteristics of said first and second inputs.

2. Apparatus according to claim 1, wherein: said third input comprises a pair of inputs.

3. Apparatus according to claim 2, wherein: each one of said pair of inputs and said first and second inputs exhibit substantially identical geometries.

4. Comb filter apparatus for processing a video signal containing image-representative luminance and chrominance components disposed within a frequency spectrum of said video signal in frequency interleaved relation, comprising:

a charge transfer device arrangement including first and second charge combining means;

means for providing first and second inputs for coupling signal charge representative of mutually complementary versions of said video signal to said first and second combining means, respectively, each of said first and second inputs having a predetermined geometry for determining its video signal voltage to charge amplitude conversion characteristic;

means for providing third and fourth inputs responsive to said video signal and having a predetermined geometry for determining the video signal voltage to charge conversion characteristic of said third and fourth inputs, said geometry of said third and fourth inputs being substantially identical to said geometry of said first and second inputs such that the effective voltage to charge amplitude conversion characteristics of said first, second, third and fourth inputs are substantially equal;

a charge transfer channel comprising a plurality of delay stages for receiving signal charge from said third and fourth inputs;

means for coupling a first delayed signal charge portion from said channel to said first combining means;

means for coupling a second delayed signal charge portion from said channel to said second combining means; and wherein each of said first and second coupled delayed signal charge portions is delayed relative to said charge coupled to the respective first and second combining means from said first and second inputs by an amount corresponding to a horizontal line scanning interval, said first and second delayed signal charge portions being substantially equal in amplitude to signal charge coupled to said first and second combining means from said first and second inputs, respectively.

5. Apparatus according to claim 4, wherein: said means for coupling said first and second delayed signal charge portions from said channel to said first and second combining means, respectively comprises means for dividing signal charge from said channel into first and second charge portions of substantially equal amplitude.

6. Apparatus according to claim 5, wherein: said first and second combining means comprise respective charge summing wells.

7. Apparatus according to claim 6, wherein: said second input is preceded by a signal inverter means for providing a complementary version of said video signal.

8. Apparatus according to claim 4, wherein: said first and second inputs each comprise a delay stage providing substantially equal amounts of delay; and said first and second delayed charge portions when combined in said combining means exhibit a delay, relative to said signal charge coupled to said first and second combining means from said first and second inputs, incrementally greater than said horizontal line scanning interval by an amount corresponding to the delay provided by said delay stages of said first and second inputs.

9. Comb filter apparatus for processing a video signal containing image-representative luminance and chrominance components disposed within a frequency spectrum of said video signal in frequency interleaved relation, comprising:

a charge transfer device arrangement including first and second charge combining means;

means for providing first and second inputs for coupling signal charge representative of mutually complementary versions of said video signal to said first and second combining means, respectively, each of said first and second inputs having a predetermined geometry for determining its video signal voltage to charge amplitude conversion characteristic;

means for providing third and fourth inputs responsive to said video signal, each of said third and fourth inputs being associated with a given channel width and having a predetermined geometry for determining the video signal voltage to charge conversion characteristic of said third and fourth inputs, said geometry of said third and fourth inputs being substantially identical to said geometry of said first and second inputs such that the effective voltage to charge amplitude conversion characteristics of said first, second, third and fourth inputs are substantially equal;

a charge transfer channel comprising a plurality of delay stages for receiving signal charge from said third and fourth inputs, said charge transfer channel exhibiting a width narrower than said given width;

means for coupling a first delayed signal charge portion from said channel to said first combining means;

means for coupling a second delayed signal charge portion from said channel to said second combining means; and wherein each of said first and second coupled delayed signal charge portions is delayed relative to said charge coupled to the respective first and second combining means from said first and second inputs by an amount corresponding to a horizontal line scanning interval, said first and second delayed signal charge portions being substantially equal in amplitude to signal charge coupled to said first and second combining means from said first and second inputs, respectively.

10. Apparatus according to claim 9, wherein:
said channel is arranged in serpentine form.

11. Apparatus according to claim 4 and further comprising:

first means coupled to said first combining means for selectively passing signal frequencies within the band of luminance signal frequencies;

second means coupled to said second combining means for selectively passing signal frequencies within a range of signal frequencies below the band of chrominance signal frequencies;

means for summing signals from said first and second frequency selective means to produce a luminance signal to the substantial exclusion of chrominance information;

third means coupled to said second combining means for selectively passing signals within the band of chrominance signal frequecies to produce a chrominance signal to the substantial exclusion of luminance information;

means for deriving color difference signals from said chrominance signal; and matrix means for combining said luminance signal from said signal summing means with said color difference signals to provide color repesentative signals.

12. Apparatus according to claim 11, wherein:
said signal coupled to said summing means from said second frequency selective means is adjustable in magnitude.

13. Apparatus according to claim 12, wherein said charge transfer device arrangement comprises:

means for delaying combined signal appearing at said first charge combining means by an amount such that said luminance signal and said color difference signals combined by said matrix means exhibit predetermined time coordination.

* * * * *